(12) United States Patent
Kerns

(10) Patent No.: US 7,679,427 B2
(45) Date of Patent: Mar. 16, 2010

(54) SEMICONDUCTOR DEVICE INCLUDING A BIAS VOLTAGE GENERATOR

(75) Inventor: Douglas Kerns, Sierra Madre, CA (US)

(73) Assignee: SuVolta, Inc., Los Gatos, CA (US)

( * ) Notice: Subject to any disclaimer, the term of this patent is extended or adjusted under 35 U.S.C. 154(b) by 193 days.

(21) Appl. No.: 11/818,388

(22) Filed: Jun. 14, 2007

(65) Prior Publication Data

US 2008/0309397 A1 Dec. 18, 2008

(51) Int. Cl.
*H01L 31/112* (2006.01)
*H01L 29/80* (2006.01)
*H03K 17/687* (2006.01)
*G05F 3/02* (2006.01)

(52) U.S. Cl. .................. 327/530; 327/430; 327/581
(58) Field of Classification Search .................. 327/430
See application file for complete search history.

(56) References Cited

U.S. PATENT DOCUMENTS

| | | | | |
|---|---|---|---|---|
| 4,020,365 A | * | 4/1977 | Weir | ............... 327/430 |
| 4,419,586 A | * | 12/1983 | Phipps | ............... 250/551 |
| 6,580,150 B1 | * | 6/2003 | Metzler | ............... 257/594 |
| 6,894,885 B2 | * | 5/2005 | Asaka et al. | ............... 361/143 |
| 7,402,869 B2 | * | 7/2008 | Peterson | ............... 257/360 |
| 2008/0100377 A1 | * | 5/2008 | Kerns | ............... 327/581 |

FOREIGN PATENT DOCUMENTS

WO WO-2008/055088 A2 8/2008

OTHER PUBLICATIONS

PCT International Search Report and Written Opinion of the International Searching Authority for International Application No. PCT/US2008/066004, dated Oct. 6, 2008.

* cited by examiner

*Primary Examiner*—Lincoln Donovan
*Assistant Examiner*—Terry L Englund
(74) *Attorney, Agent, or Firm*—Darryl G. Walker

(57) ABSTRACT

A semiconductor device including a bias voltage generator formed from a junction field effect transistor (JFET). The JFET includes a control gate terminal and a first and a second source/drain terminal. The first and second source/drain terminals can form a first terminal of a p-n junction and the control gate terminal can form a second terminal of the p-n junction. The first terminal of the p-n junction can be provided with a first potential. The second terminal can be left essentially floating to provide a bias voltage. A bias receiving circuit can receive the bias voltage. The bias receiving circuit can be in close proximity on the semiconductor device to the bias voltage generator.

29 Claims, 6 Drawing Sheets

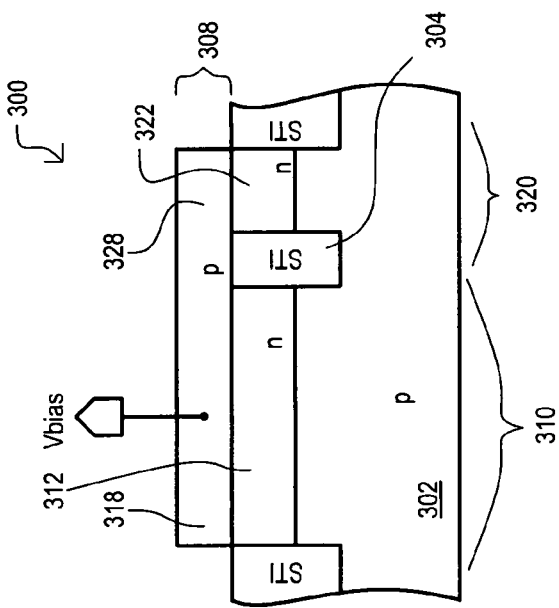
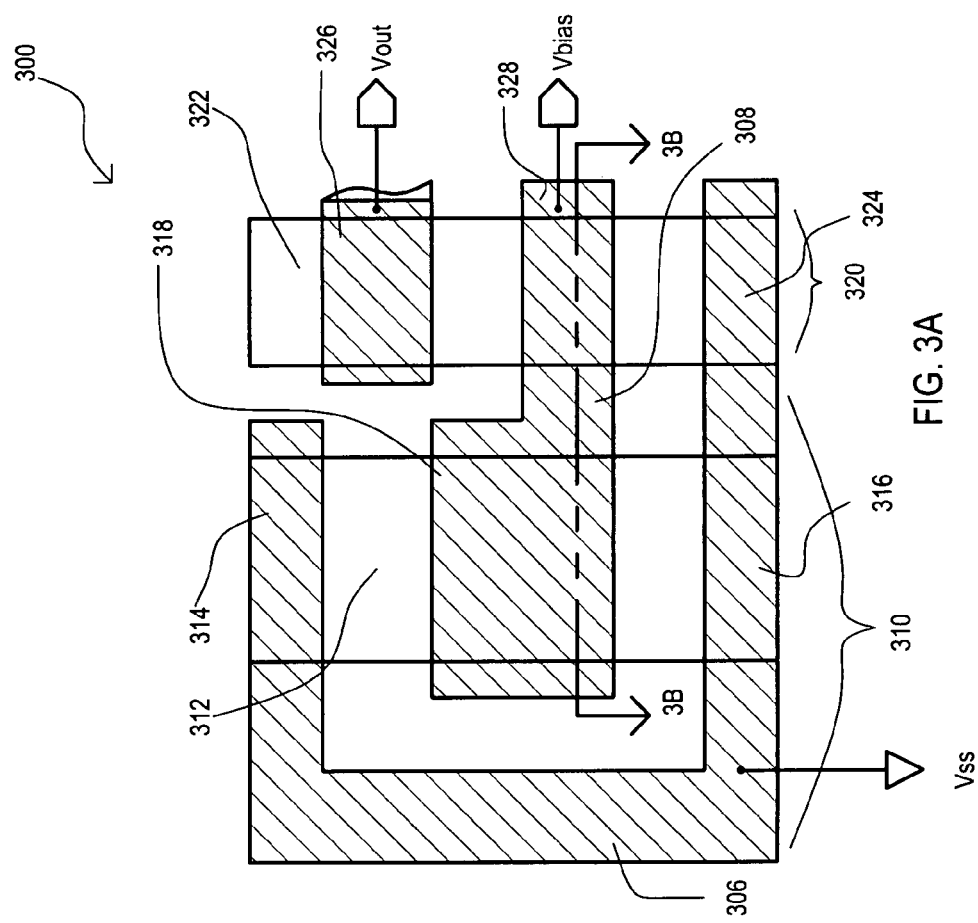
FIG. 3B
FIG. 3A

SEMICONDUCTOR DEVICE INCLUDING A BIAS VOLTAGE GENERATOR

TECHNICAL FIELD

The present invention relates generally to semiconductor devices, and more particularly to a bias voltage generating method and device.

BACKGROUND OF THE INVENTION

Semiconductor devices use bias voltages for many applications. Bias voltages and/or reference voltages can be used in many electronic circuits including both analog and digital circuits. As feature sizes in semiconductor devices are decreased, power supply voltages can be decreased to prevent devices from breaking down due to excessive electric fields. However, bias voltages are still necessary and can consume a significant amount of circuit area.

Furthermore, bias voltages may be generated on a device and then routed to circuits that are not located near the bias voltage generator. Thus, the bias voltage routing may consume even more critical space on the semiconductor device.

SUMMARY OF THE INVENTION

According to the present embodiments, semiconductor device including a bias voltage generator and a bias voltage receiving circuit is disclosed. The bias voltage generator may include a p-n junction having a first terminal and a second terminal. The first terminal can be connected to a first potential and the second terminal may be essentially floating. The second terminal may provide a bias voltage to a bias receiving circuit.

In one embodiment, the p-type material of the bias voltage generator may be the second terminal and the n-type material of the bias voltage generator may be connected to a ground potential. The bias voltage may be a potential greater than the first potential.

In another embodiment, the n-type material of the bias voltage generator may be the second terminal and the p-type material of the bias voltage generator may be connected to a power supply potential. The bias voltage may be a potential less than the first potential.

According to the embodiments, the bias voltage generator may be formed with a junction field effect transistor (JFET) having a gate terminal that is essentially floating while a first source/drain terminal and a second source/drain terminal may be connected to a first potential.

In one embodiment the JFET may be an n-channel JFET and the bias voltage may be greater than the first potential. The first potential may be a ground potential.

In another embodiment the JFET may be a p-channel JFET and the bias voltage may be less than the first potential. The first potential may be a power supply potential.

According to the embodiments, the bias voltage generator may be in close proximity on the semiconductor device as the bias receiving circuit. A plurality of bias receiving circuits may be disposed in an area of close proximity the bias voltage generator to receive the bias voltage. In this way, a localized bias voltage may be generated in close proximity to the bias receiving circuits. Furthermore, the bias voltage generator may consist only of a single component, a JFET, or the like.

BRIEF DESCRIPTION OF THE DRAWINGS

FIG. 3A is a plan schematic diagram of a semiconductor device including a bias voltage generator and a bias receiving device according to an embodiment.

FIG. 3B is a cross-sectional schematic diagram of semiconductor device of FIG. 3A through the line 3B-3B according to an embodiment.

DETAILED DESCRIPTION OF THE EMBODIMENTS

The present invention is directed to a method and circuit for generating a bias voltage that may be used for various applications on a semiconductor device.

In the following description, for purposes of explanation, numerous specific details are set forth in order to provide a thorough understanding of the present invention. It will be evident, however, to one skilled in the art that the present invention may be practices without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" or "electrically connect" as used herein may include both to directly and to indirectly connect through one or more intervening components.

The circuits of the present invention can be used on a semiconductor device and more particularly a semiconductor device including junction field effect transistors (JFETs) or the like.

Various embodiments of the present invention will now be described in detail with reference to a number of drawings.

Figure 1:
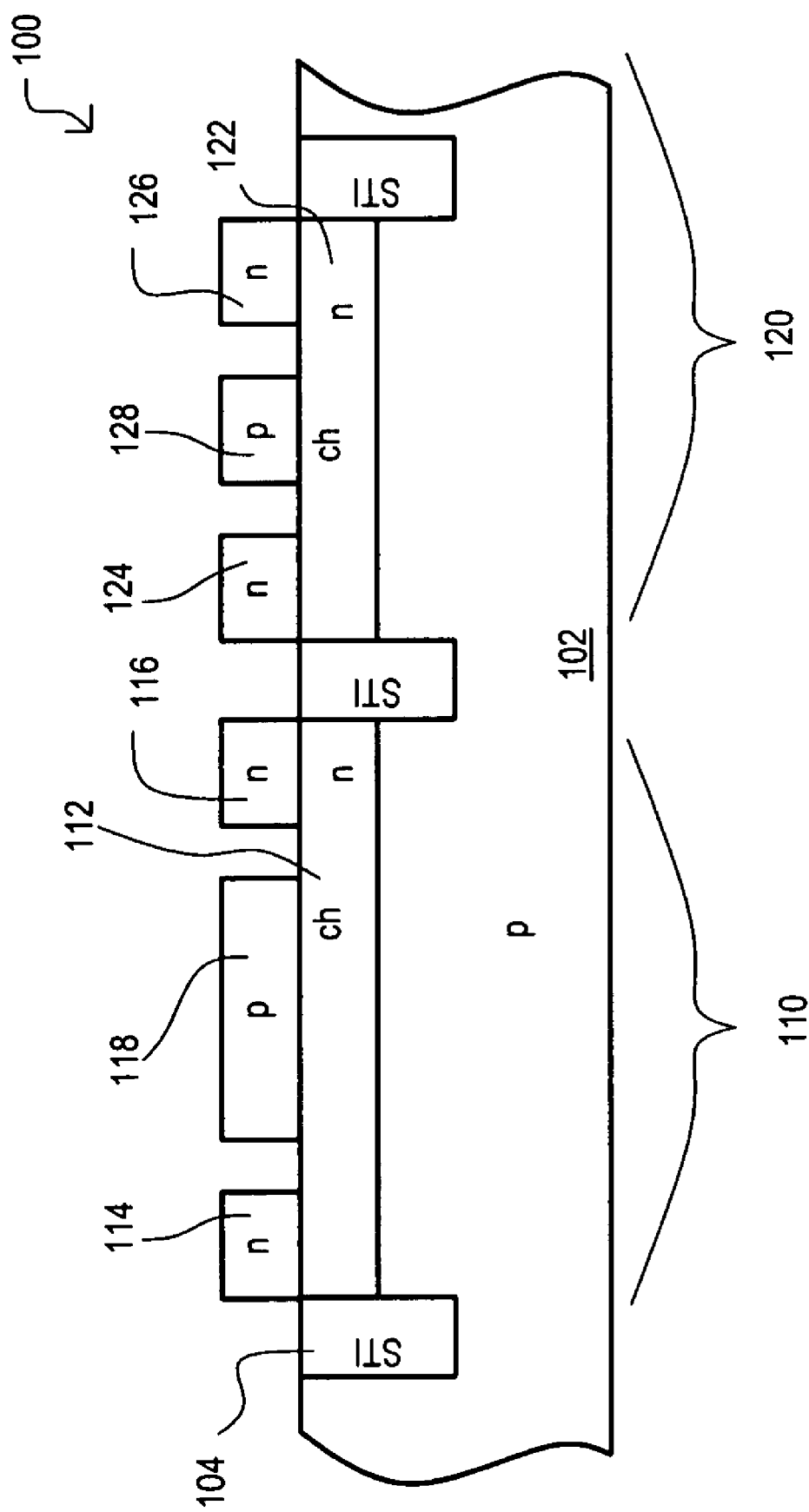
FIG. 1 is a cross sectional diagram of a semiconductor device including a bias voltage generator according to an embodiment.

Referring now to FIG. 1, a cross sectional diagram of a semiconductor device including a bias voltage generator according to an embodiment is set forth and given the general reference character 100. The semiconductor device 100 can include a bias voltage generator 110 and a bias voltage receiving device 120 formed on a substrate 102. Substrate 102 may be a p-type semiconductor substrate.

Bias voltage generator 110 can be formed between isolation regions 104. Isolation regions 104 can be a shallow trench isolation (STI), as but one example. Bias voltage generator 110 can include a channel region 112, a first source/drain terminal 114, a second source/drain terminal 116, and a gate terminal 118. The bias voltage generator 110 can be a junction field effect transistor (JFET) structure having a gate terminal 118 that floats to a bias potential.

Channel region 112 may be an n-type doped semiconductor region. First source/drain terminal 114 and second source/drain terminal 116 may be n-type doped polysilicon and gate terminal 118 may be p-type doped polysilicon.

Bias generator 110 may have first and second source/drain terminals (114 and 116) connected to a first potential, such as ground VSS for example. However, gate terminal 118 may be left to float (i.e. not connected to a significant current sinking or sourcing structure). In this way, a potential formed by a collection of charge carriers on gate terminal 118 may generate a bias potential.

Voltage receiving device 120 can be formed between isolation regions 104. Voltage receiving device 120 can include a channel region 122 a source terminal 124, a drain terminal 126, and a gate terminal 128. Voltage receiving device 120 can be a JFET and more particularly may be an n-channel JFET.

Channel region 122 may be an n-type doped semiconductor region. Source terminal 124 and drain terminal 126 may be n-type doped polysilicon and gate terminal 128 may be p-type doped polysilicon.

Bias voltage generator 110 may provide a bias potential in the following manner. A depletion region may be formed between the n-type channel region 112 and the p-type gate terminal 118. Electromagnetic waves may strike the depletion region 112 with sufficient energy to create electron-hole pairs. The electromagnetic waves may be created by sources such as blackbody radiation, as just one example. An electric field in the depletion region may drive the electrons to the n-type channel region and the holes to the p-type gate terminal 118. Thus, the created electron-hole pair may be separated before recombination and may form a current to charge the gate terminal 118. This voltage can be limited to the potential barrier of the p-n junction formed by the gate terminal 118 and channel region 112, which is about 0.6 volts. However, due to parasitic leakage, the bias voltage on gate terminal 118 may be about 0.5 volts and may vary due to temperature, area of the p-n junction formed by gate terminal 118 and channel region 112 and/or other factors. It should be noted that electron-hole pairs may be generated by other types of radiation impinging on the structure to generate the bias voltage at gate terminal 118.

The bias voltage formed at gate terminal 118 may be used as a bias voltage for voltage receiving device 120. For example, voltage receiving device 120 may be a JFET and may receive the bias voltage on gate terminal 128 by forming an electrical connection between gate terminal 118 and gate terminal 128.

Channel regions (112 and 122) may be formed by ion implantation with an n-type dopant such as arsenic, phosphorous, or antimony with an implant of $2.0\times10^{11}/cm^2$ to $1.0\times10^{14}/cm^2$ or lesser or greater and with an implant energy between 1 and 100 KeV, or lesser or greater. Gate terminals (118 and 128) may be formed by ion implantation with a p-type dopant such as boron with an implant of $1.0\times10^{13}/cm^2$ to $1.0\times10^{16}/cm^2$ or lesser or greater and with an implant energy between 1 and 100 KeV, or lesser or greater. Source and drain terminals (114, 116, 124 and 126) may be formed by ion implantation with an n-type dopant such as arsenic, phosphorous, or antimony with an implant of $1.0\times10^{13}/cm^2$ to $1.0\times10^{16}/cm^2$ or lesser or greater and with an implant energy between 1 and 100 KeV, or lesser or greater.

In the semiconductor device 100 of FIG. 1, a bias voltage generator 110 and a bias receiving device 120 may be formed on a single integrated circuit. The bias circuit 110 may be formed from a single electronic component, such as a JFET. The bias receiving device 120 may be a JFET and may be in close proximity on the semiconductor device as bias voltage generator 110.

Figure 2:
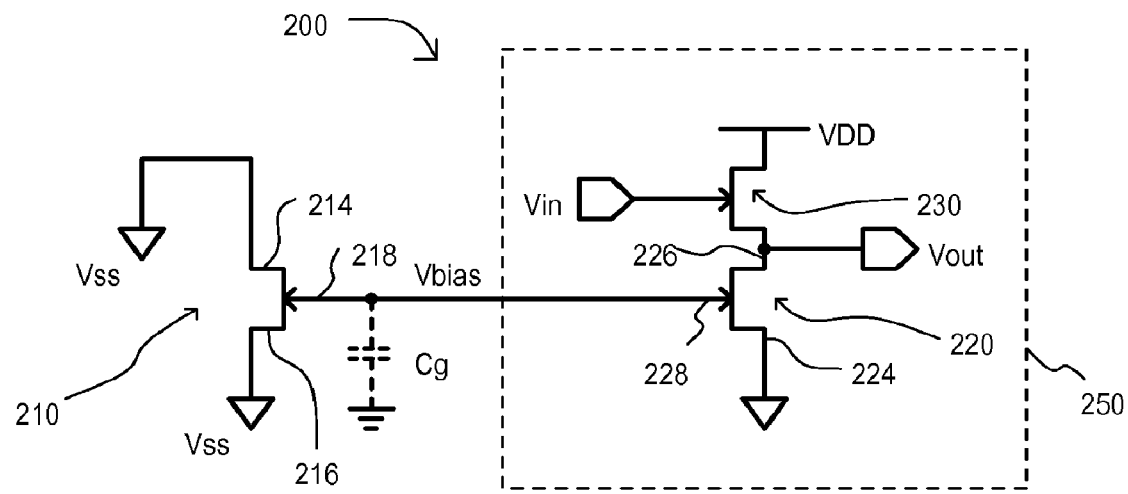
FIG. 2 is a circuit schematic diagram of a semiconductor device including a bias voltage generator and a bias receiving circuit according to an embodiment.

Referring now to FIG. 2, a circuit schematic diagram of a semiconductor device including a bias voltage generator and a bias receiving circuit according to an embodiment is set forth and given the general reference character 200.

Semiconductor device 200 may include a bias voltage generator 210 and a bias receiving circuit 250. Bias voltage generator 210 may be formed from a JFET and more particularly may be from an n-channel JFET.

Bias voltage generator 210 may provide a bias voltage Vbias to bias receiving circuit 250. Bias receiving circuit may also receive an input signal Vin as an input and may provide an output signal Vout as an output.

Bias voltage generator 210 may include a first source/drain terminal 214, a second source/drain terminal 216 and a gate terminal 218. First source/drain terminal 214 and second source/drain terminal may be connected to a predetermined potential, in this case a ground potential VSS. Gate terminal may be essentially floating such that a bias voltage Vbias may be generated in a manner as described above with respect to the embodiment of FIG. 1. A capacitor Cg, formed from parasitic gate capacitance and/or conductor capacitance may hold bias voltage Vbias. Bias voltage Vbias may be provided to a bias receiving circuit 250.

Bias receiving circuit 250 may include a bias receiving device 220 and an active device 230. Bias receiving device 220 may be a JFET and more particularly may be a n-channel JFET. Active device 230 may be a JFET and in particularly may be a n-channel JFET.

Bias receiving device 220 may have a source terminal 224 connected to a ground VSS, a drain terminal 226 connected to a source of active device 230, and a gate terminal 228 connected to receive bias voltage Vbias. Active device 230 may have a drain terminal connected to a power supply VDD and a gate terminal connected to receive input signal Vin. Output signal Vout may be provided at a common connection of the source terminal of active device 230 and the drain terminal of bias receiving device 220.

Bias receiving device 220 may provide a load function to active device 230. In the particular embodiment, bias receiving circuit 250 may provide a buffering function of input signal Vin to drive output signal Vout as a source follower. This is but one example of the use of a locally generated bias voltage Vbias.

As mentioned with respect to FIG. 1 above, a bias voltage Vbias may be provided with a single bias voltage generating device, such as bias voltage generator 210. Bias voltage generator 210 may be generated in close proximity on a semiconductor device 200 to bias receiving circuit 250. By doing so, a bias voltage may not need to be routed over long distances on a semiconductor device 200 and routing channels may be minimized, thereby reducing the overall size of the semiconductor device 200.

Referring now to FIG. 3A, a plan schematic diagram of a semiconductor device including a bias voltage generator and a bias receiving device according to an embodiment is set forth and given the general reference character 300.

Semiconductor device 300 may include bias voltage generator 310 and bias receiving device 320. Bias receiving device 320 may be part of a bias receiving circuit, such as bias receiving circuit 250 of FIG. 2, as but one example.

Bias voltage generator 310 may include a first source/drain terminal 314, a second source/drain terminal 316, a gate terminal 318, and a channel region 312. The first and second source/drain terminals (314 and 316) may be formed from n-type doped polysilicon. The gate terminal 318 may be formed from p-type doped polysilicon. The channel region 312 may be implanted with n-type impurities and may be considered an "active" region.

Bias receiving device 320 may include a source terminal 324, a drain terminal 326, and a gate terminal 328 formed over an active region 322. The source and drain terminals (324 and 326) may be formed from n-type doped polysilicon. The gate terminal 328 may be formed from p-type doped polysilicon. The active region 312 may be implanted with n-type impurities and may form a channel region for bias receiving device 320.

Note, the first and second source drain terminals (314 and 316) of the bias voltage generator 310 and the source terminal 324 of bias receiving device 320 may be commonly connected to a predetermined potential, in this case ground VSS, through a common n-type polysilicon wiring line 306. Likewise, the gate terminal 318 of bias voltage generator 310 and the gate terminal 328 of bias receiving device 320 may be commonly connected through a common contiguous p-type polysilicon wiring line 308. In this way, a bias voltage Vbias may be generated locally from a bias voltage generator 310 and provided to a bias receiving device 320.

FIG. 3B is a cross-sectional schematic diagram of semiconductor device 300 of FIG. 3A through the line 3B-3B according to an embodiment.

Referring now to FIG. 3B, bias voltage generator 310 and bias receiving device 320 may be formed on a semiconductor substrate 302. Semiconductor substrate 302 may be a p-type semiconductor substrate. Bias voltage generator 310 and bias receiving device 320 may be separated by an isolation structure 304. Isolation structure may be a shallow trench isolation (STI) structure. Bias voltage generator 310 may include a gate terminal 318 formed over a channel region 312. Likewise, bias receiving circuit may include a gate terminal 328 formed over a channel region 322. Gate terminal 318 of bias voltage generator 310 and gate terminal 328 of bias receiving device 320 may be formed from a common p-type polysilicon layer 308. The common p-type polysilicon layer may be essentially electrically floating so that a bias voltage Vbias may be generated by bias voltage generator 310 in a manner as described with reference to FIG. 1.

Referring now to FIG. 1 in conjunction with FIGS. 3A and 3B. The bias voltage generator 110 and bias receiving device 120 of FIG. 1 are orientated differently than the bias voltage generator 310 and bias receiving device 320 of FIGS. 3A and 3B. Conceptually, the bias voltage generator 110 and bias receiving device 120 of FIG. 1 may be formed in series (i.e. source/drain paths formed in series but separated by isolation region 104). However, the bias voltage generator 310 and bias receiving device 320 of FIGS. 3A and 3B may be formed in parallel (i.e. the source/drain paths formed in parallel but separated by isolation region 304). In other words, by forming the bias voltage generator 310 having a first source/drain path in parallel with the bias receiving device 320 having a second source/drain path in parallel, the gate terminals (318 and 328) may be connected with the same contiguous layer, conductor line 308, which may eliminate the need for extra contacts and the use of a signal strapping layer to connect the bias voltage Vbias from the bias voltage generator 310 and bias receiving device 320. This may further minimize area consumption and may further reduce overall device size.

Figure 4:
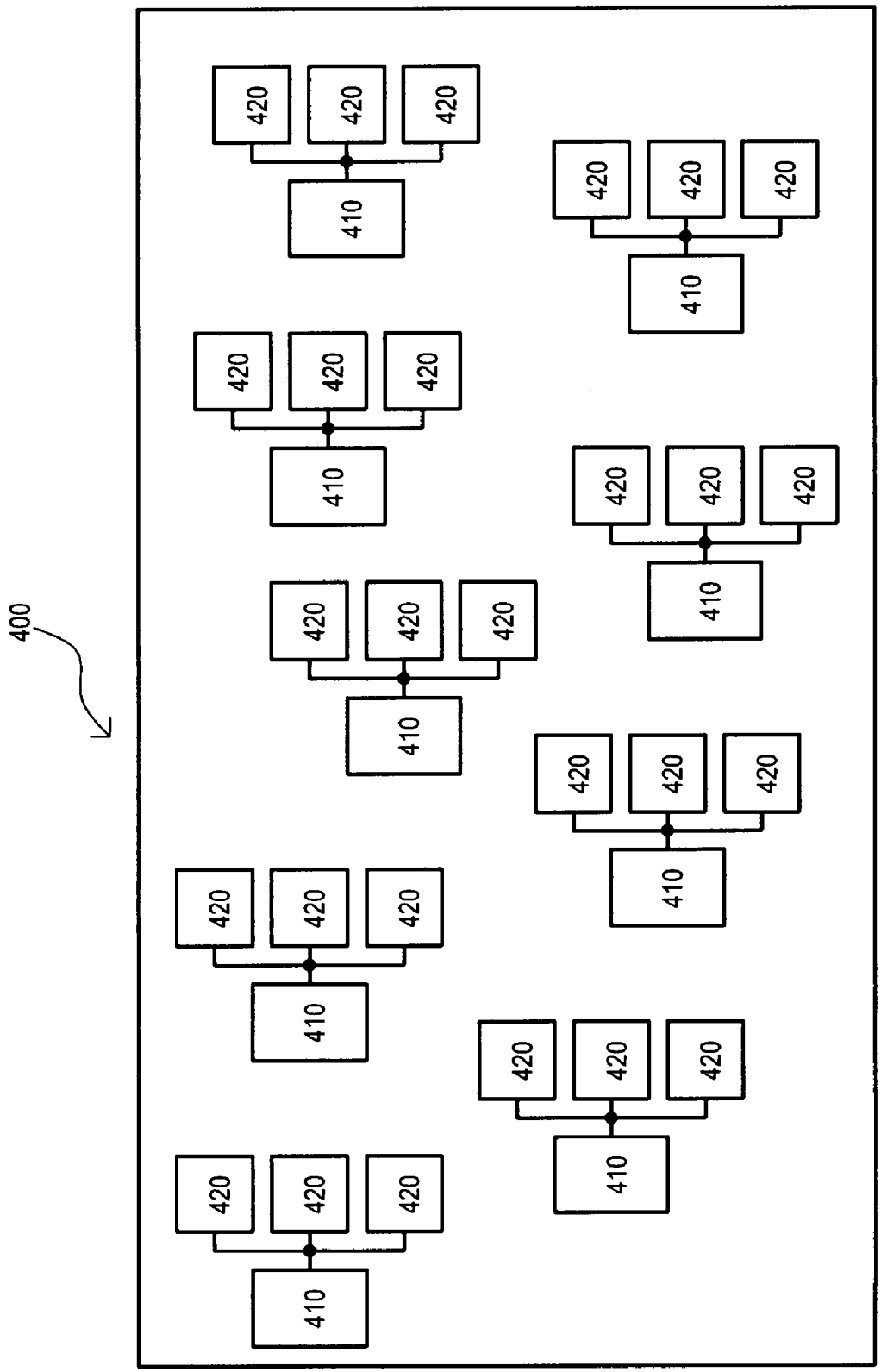
FIG. 4 is a plan diagram of a semiconductor device including a plurality of bias generating voltages and bias receiving circuits according to an embodiment.

Referring now to FIG. 4, a plan diagram of a semiconductor device including a plurality of bias generating voltages and bias receiving circuits according to an embodiment is set forth and given the general reference character 400.

Semiconductor device 400 may include a plurality of bias voltage generators 410. Each bias voltage generator 410 may generate a bias voltage Vbias. Each bias voltage generator 410 may respectively provide its locally generated bias voltage Vbias to a plurality of respective bias receiving devices 420 locally disposed in a general close proximity to the respective bias voltage generator 410. In this way, a bias voltage Vbias may be locally generated wherever necessary on a semiconductor device 400 without the need to transmit the bias voltage on a common bias voltage bus throughout the semiconductor device 400. This may reduce complexity of routing channels and may reduce extraneous noise, due to crosstalk or the like on a bias voltage Vbias. Additionally, by providing a respective bias voltage generator 410 in close proximity to the respective bias receiving devices 420, properties such as material composition and operating temperatures may closely match between the respective bias voltage generator 410 and respective bias receiving devices 420. This can reduce operational variations that may be caused by mismatches due to process and temperature variations over areas not in close proximity on a monolithic integrated circuit device.

The bias voltage generator 410 may correspond to any of bias voltage generators (110, 210, and 310) of FIGS. 1, 2, 3A, and 3B, respectively.

Figure 5:
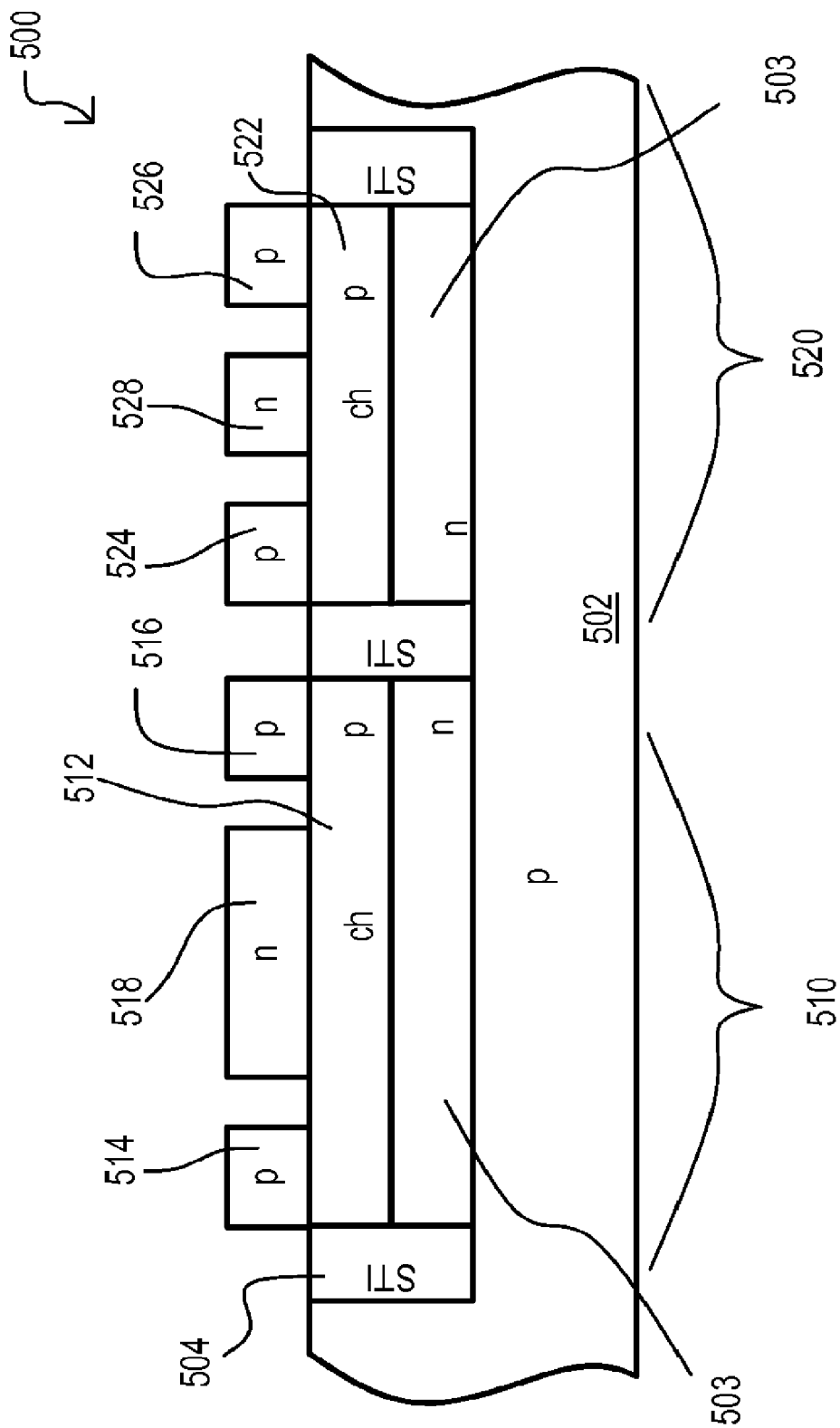
FIG. 5 is a cross sectional diagram of a semiconductor device including a bias voltage generator according to an embodiment.

Referring now to FIG. 5, a cross sectional diagram of a semiconductor device including a bias voltage generator according to an embodiment is set forth and given the general reference character 500. The semiconductor device 500 can include a bias voltage generator 510 and a bias voltage receiving device 520 formed in a n-well 503 on a substrate 502. Substrate 502 may be a p-type semiconductor substrate.

Bias voltage generator 510 can be formed between isolation regions 504. Isolation regions 504 can be a shallow trench isolation (STI), as but one example. Bias voltage generator 510 can include a channel region 512, a first source/drain terminal 514, a second source/drain terminal 516, and a gate terminal 518. The bias voltage generator 510 can be a junction field effect transistor (JFET) structure having a gate terminal 518 that floats to a bias potential.

Channel region 512 may be an p-type doped semiconductor region. First source/drain terminal 514 and second source/drain terminal 516 may be p-type doped polysilicon and gate terminal 518 may be n-type doped polysilicon.

Bias generator 510 may have first and second source/drain terminals (514 and 516) connected to a first potential, such as a power supply VDD for example. However, gate terminal 518 may be left to essentially float (i.e. not connected to a significant current sinking or sourcing structure). In this way, a potential formed by a collection of charge carriers on gate terminal 518 may generate a bias potential.

Voltage receiving device 520 can be formed between isolation regions 504. Voltage receiving device 520 can include a channel region 522 a source terminal 524, a drain terminal 526, and a gate terminal 528. Voltage receiving device 520 can be a JFET and more particularly may be an p-channel JFET.

Channel region 522 may be a p-type doped semiconductor region. Source terminal 524 and drain terminal 526 may be p-type doped polysilicon and gate terminal 528 may be n-type doped polysilicon.

Bias voltage generator 510 may provide a bias potential in the following manner. A depletion region may be formed between the p-type channel region 512 and the n-type gate terminal 518. Electromagnetic waves may strike the depletion region with sufficient energy to create electron-hole pairs. The electromagnetic waves may be created by sources such as background radiation, as just one example. An electric field in the depletion region may drive the holes to the p-type channel region 512 and the electrons to the n-type gate terminal 518. Thus, the created electron-hole pair may be separated before recombination and may form a current to charge the gate terminal 518. This voltage can be limited to the potential barrier of the p-n junction formed by the gate terminal 518 and channel region 512, which is about VDD−0.6 volts, because the channel region 512 is forced to power supply voltage VDD through the first and second source/drain terminals (514 and 516). However, due to parasitic leakage, the bias voltage on gate terminal 518 may be about VDD−0.5 volts and may vary due to temperature, area of the p-n junction formed by gate terminal 518 and channel region 512 and/or other factors.

The bias voltage formed at gate terminal 518 may be used as a bias voltage for voltage receiving device 520. For example, voltage receiving device 520 may be a JFET and may receive the bias voltage on gate terminal 528 by forming an electrical connection between gate terminal 518 and gate terminal 528.

Channel regions (512 and 522) may be formed by ion implantation with an p-type dopant such as boron with an implant of $2.0 \times 10^{11}/cm^2$ to $1.0 \times 10^{14}/cm^2$ or lesser or greater and with an implant energy between 1 and 100 KeV, or lesser or greater. Gate terminals (518 and 528) may be formed by ion implantation with an n-type dopant such as arsenic, phosphorous, or antimony with an implant of $1.0 \times 10^{13}/cm^2$ to $1.0 \times 10^{16}/cm^2$ or lesser or greater and with an implant energy between 1 and 100 KeV, or lesser or greater. Source and drain terminals (514, 516, 524 and 526) may be formed by ion implantation with a p-type dopant such as boron with an implant of $1.0 \times 10^{13}/cm^2$ to $1.0 \times 10^{16}/cm^2$ or lesser or greater and with an implant energy between 1 and 100 KeV, or lesser or greater.

In the semiconductor device 500 of FIG. 5, a bias voltage generator 510 and a bias receiving device 520 may be formed on a single integrated circuit. The bias circuit 510 may be formed from a single electronic component, such as a JFET. The bias receiving device 520 may be a JFET and may be in close proximity on the semiconductor device as bias voltage generator 510.

Figure 6:
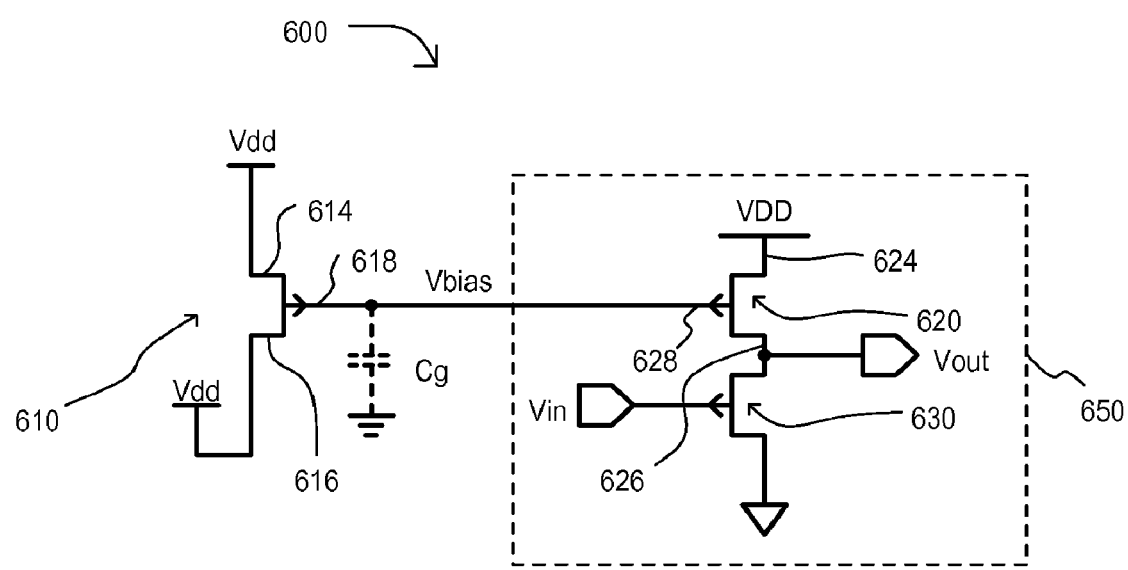
FIG. 6 is a circuit schematic diagram of a semiconductor device including a bias voltage generator and a bias receiving circuit according to an embodiment.

Referring now to FIG. 6, a circuit schematic diagram of a semiconductor device including a bias voltage generator and a bias receiving circuit according to an embodiment is set forth and given the general reference character 600.

Semiconductor device 600 may include a bias voltage generator 610 and a bias receiving circuit 650. Bias voltage generator 610 may be formed from a JFET and more particularly may be from a p-channel JFET.

Bias voltage generator 610 may provide a bias voltage Vbias to bias receiving circuit 650. Bias receiving circuit may also receive an input signal Vin as an input and may provide an output signal Vout as an output.

Bias voltage generator 610 may include a first source/drain terminal 614, a second source/drain terminal 616 and a gate terminal 618. First source/drain terminal 614 and second source/drain terminal 616 may be connected to a predetermined potential, in this case a power supply VDD. Gate terminal may be essentially floating such that a bias voltage Vbias may be generated in a manner as described above with respect to the embodiment of FIG. 5. A capacitor Cg, formed from parasitic gate capacitance and/or conductor capacitance may hold bias voltage Vbias. Bias voltage Vbias may be provided to a bias receiving circuit 650.

Bias receiving circuit 650 may include a bias receiving device 620 and an active device 630. Bias receiving device 620 may be a JFET and more particularly may be a p-channel JFET. Active device 630 may be a JFET and in particularly may be a p-channel JFET.

Bias receiving device 620 may have a source terminal 624 connected to a power supply potential VDD, a drain terminal 626 connected to a source of active device 630, and a gate terminal 628 connected to receive bias voltage Vbias. Active device 630 may have a drain terminal connected to a ground potential VSS and a gate terminal connected to receive input signal Vin. Output signal Vout may be provided at a common connection of the source terminal of active device 630 and the drain terminal of bias receiving device 620.

Bias receiving device 620 may provide a load function to active device 630. In the particular embodiment, bias receiving circuit 650 may provide a buffering function of input signal Vin to drive output signal Vout as a source follower. This is but one example of the use of a locally generated bias voltage Vbias.

As mentioned with respect to FIG. 5 above, a bias voltage Vbias may be provided with a single bias voltage generating device, such as bias voltage generator 610. Bias voltage generator 610 may be generated in close proximity on a semiconductor device 600 to bias receiving circuit 650. By doing so, a bias voltage may not need to be routed over long distances on a semiconductor device 600 and routing channels may be minimized, thereby reducing the overall size of the semiconductor device 600.

Figure 7:
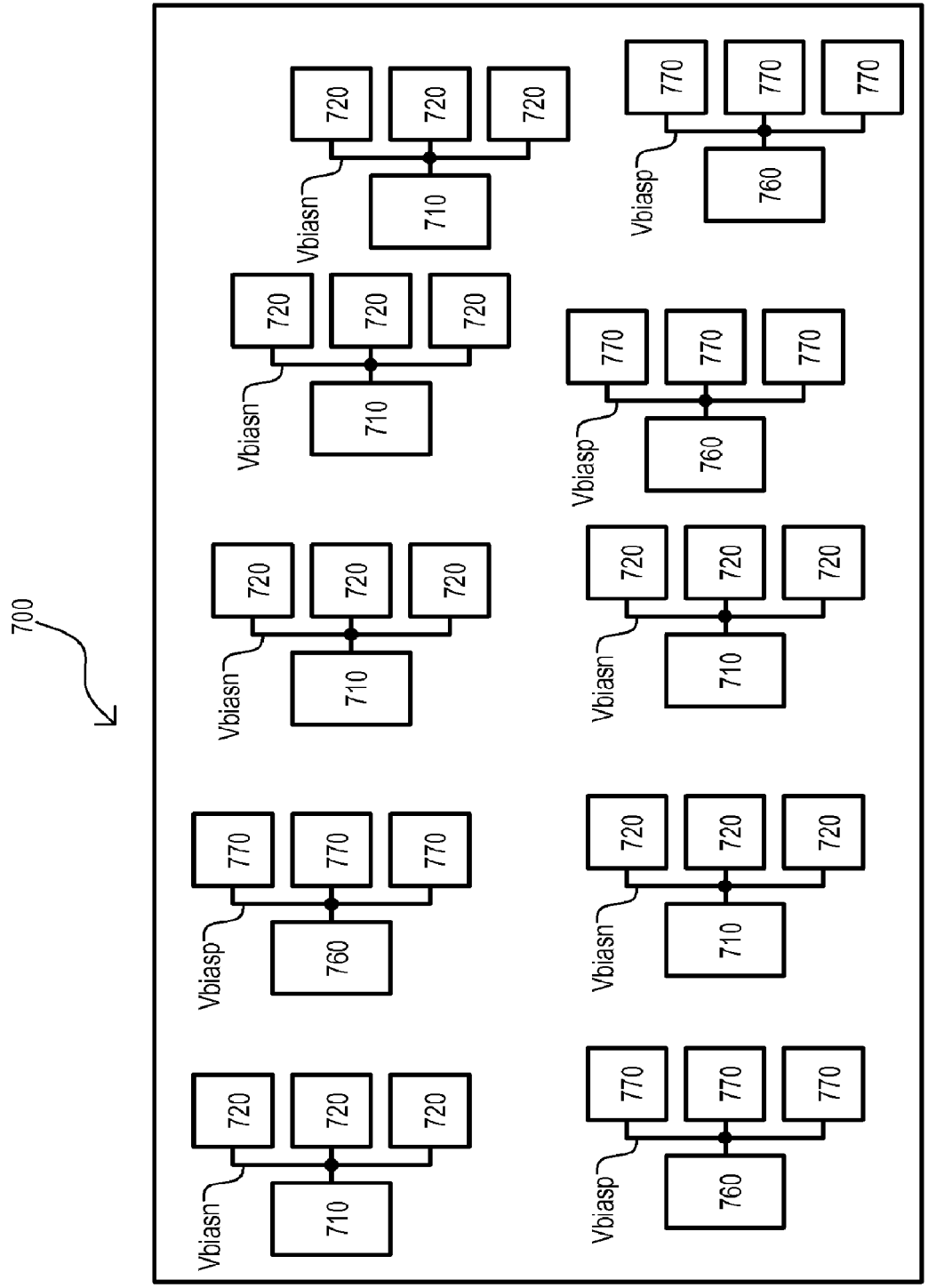
FIG. 7 is a plan diagram of a semiconductor device including a plurality of bias generating voltages and bias receiving circuits according to an embodiment.

Referring now to FIG. 7, a plan diagram of a semiconductor device including a plurality of bias generating voltages and bias receiving circuits according to an embodiment is set forth and given the general reference character 700.

Semiconductor device 700 may include a plurality of bias voltage generators 710 and 760. Each bias voltage generator 710 may generate a bias voltage Vbiasn and each bias voltage generator 760 may generate a bias voltage Vbiasp. Each bias voltage generator of 710 may respectively provide its locally generated bias voltage Vbiasn to a plurality of respective bias receiving devices 720 locally disposed in a general close proximity to the respective bias voltage generator 710. Each bias voltage generator 760 may respectively provide its locally generated bias voltage Vbiasp to a plurality of respective bias receiving devices 770 locally disposed in a general close proximity to the respective bias voltage generator 760. In this way, a bias voltage Vbiasp may be locally generated wherever necessary on a semiconductor device 700 without the need to transmit the bias voltage on a common bias voltage bus throughout the semiconductor device 700. This may reduce complexity of routing channels and may reduce extraneous noise, due to crosstalk or the like on a bias voltage Vbiasn or bias voltage Vbiasp. Various bias voltage generators (710 and 760) may not be in close proximity to each other.

The bias voltage generator 710 may correspond to any of bias voltage generators (110, 210, and 310) of FIGS. 1, 2, 3A, and 3B, respectively. The bias voltage generator 760 may correspond to any of bias voltage generators (510 and 610) of FIGS. 5 and 6, respectively. In this way, bias voltage generator 710 may be used for a localized bias voltage generator to bias n-type JFETs and bias voltage generator 760 may be used for a localized bias voltage generator to bias p-channel JFETs.

When a bias voltage generator (510, 610, or 760) is used, in conjunction with a plan structure as illustrated in FIGS. 3A and 3B, the common contiguous polysilicon wiring line 308 may be n-type polysilicon and the JFET forming the bias receiving device 320 may be a p-channel JFET. This may be accomplished by reversing the doping types illustrated in FIGS. 3A and 3B by having the n-types become p-types and the p-types become n-types.

N-type layers/regions may be formed by doping with n-type impurities, such as arsenic, phosphorous, antimony, or the like. P-type layers/regions may be formed by doping with p-type impurities, such as boron or the like.

The semiconductor devices of the embodiments may be manufactured in accordance with known process steps.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
a bias voltage generator including a p-n junction having a first terminal coupled to a first potential and a second terminal that is essentially floating to provide a bias voltage;
a bias voltage receiving circuit coupled to receive the bias voltage wherein
the bias voltage receiving circuit includes a first junction field effect transistor (JFET) having a first JFET control gate terminal coupled to receive the bias voltage and the first JFET provides a load for the bias voltage receiving circuit and the bias voltage receiving circuit is a source follower.

2. The semiconductor device of claim 1, wherein:
the p-n junction is included in a second JFET having a second JFET control gate terminal and a first source/drain terminal, at least a portion of the first terminal comprising the first source/drain terminal and the second terminal comprising the second JFET control gate terminal.

3. The semiconductor device of claim 2, wherein:
the second JFET includes a second source/drain terminal comprising another portion of the first terminal.

4. The semiconductor device of claim 1, wherein:
the p-n junction includes p-type material and n-type material;
the second terminal is formed from the p-type material and the first JFET is a n-channel JFET; and
the bias voltage is greater than the first potential.

5. The semiconductor device of claim 4, wherein:
the first potential is a ground potential.

6. The semiconductor device of claim 1, wherein:
the p-n junction includes p-type material and n-type material;
the second terminal is formed from the n-type material and the first JFET is a p-channel JFET; and
the bias voltage is less than the first potential.

7. The semiconductor device of claim 6, wherein the first potential is a power supply potential.

8. The semiconductor device of claim 1, wherein:
the bias voltage generator consists of a second JFET having a second JFET control gate terminal and a first source/drain terminal, the p-n junction is included in the second JFET, the first terminal comprising the first source/drain terminal and the second terminal comprising the second JFET control gate terminal.

9. The semiconductor device of claim 1, wherein:
the first JFET control gate terminal and the second terminal of the bias voltage generator are formed from a layer doped with impurities.

10. The semiconductor device of claim 9, wherein:
the layer is a polysilicon layer and the impurities are p-type impurities.

11. The semiconductor device of claim 9, wherein:
the layer is a polysilicon layer and the impurities are n-type impurities.

12. The semiconductor device of claim 1, wherein:
the bias voltage generator and the bias voltage receiving circuit are in close proximity with each other on the semiconductor device.

13. A semiconductor device, comprising:
a first bias voltage generator including a first p-n junction having a first terminal coupled to a first potential and a second terminal that is essentially floating to provide a first bias voltage; and
a first bias receiving circuit formed in close proximity on the semiconductor device to the first bias voltage generator and coupled to receive the first bias voltage wherein
the p-n junction is included in a junction field effect transistor (JFET);
the second terminal is a control gate terminal of the JFET; and
the first bias voltage is generated by radiation striking a depletion region formed by the first p-n junction.

14. The semiconductor device of claim 13, further including:
a second bias voltage generator including a second p-n junction having a third terminal coupled to a second potential and a fourth terminal that is essentially floating to provide a second bias voltage; and
a second bias receiving circuit formed in close proximity on the semiconductor device to the second bias voltage generator and coupled to receive the second bias voltage.

15. The semiconductor device of claim 14, wherein:
the first and second bias voltage generators are not in close proximity to each other on the semiconductor device.

16. The semiconductor device of claim 14, wherein:
the first bias voltage generator provides a first bias voltage that is greater than the first potential; and
the second bias voltage generator provides a second bias voltage that is greater than the second potential.

17. The semiconductor device of claim 16, wherein:
the first potential and the second potential are each a ground potential.

18. The semiconductor device of claim 14, wherein:
the first bias voltage generator provides a first bias voltage that is less than the first potential; and
the second bias voltage generator provides a second bias voltage that is less than the second potential.

19. The semiconductor device of claim 18, wherein:
the first potential and the second potential are each a power supply potential.

20. The semiconductor device of claim 14, wherein:
the first bias voltage generator provides a first bias voltage that is greater than the first potential; and
the second bias voltage generator provides a second bias voltage that is less than the second potential.

21. The semiconductor device of claim 18, wherein:
the first potential is a ground potential and the second potential is a power supply potential.

22. The semiconductor device of claim 13, further including:
a second bias receiving circuit formed in close proximity on the semiconductor device to the first bias voltage generator and coupled to receive the first bias voltage.

23. The semiconductor device of claim 22, further including:
a second bias voltage generator including a second p-n junction having a first terminal coupled to a second potential and a second terminal that is essentially floating to provide a second bias voltage; and
a third bias receiving circuit formed in close proximity on the semiconductor device to the second bias voltage generator and coupled to receive the second bias voltage.

24. The semiconductor device of claim 23, wherein:
the first and second bias voltage generators are not in close proximity to each other on the semiconductor device.

25. A method for creating a bias voltage on a semiconductor device including a p-n junction having a first terminal and a second terminal, comprising the steps of:
essentially floating the first terminal while applying a potential to the second terminal wherein the first terminal provides the bias voltage wherein
the first terminal is formed by a control gate for a junction field effect transistor (JFET) and the second terminal is formed by at least a first source/drain region
wherein the bias voltage is generated by radiation striking a depletion region formed by the p-n junction.

26. The method of claim 25, wherein:
the first terminal is formed by a p-type layer and the second terminal is formed by an n-type semiconductor region.

27. The method of claim 25, wherein:
the first terminal is formed by an n-type layer and the second terminal is formed by a p-type semiconductor region.

28. The method of claim 25, further including the steps of:
providing the bias voltage to a bias voltage receiving circuit including a second junction field effect transistor (JFET); and
receiving the bias voltage at a control gate terminal of the second JFET.

29. The method of claim 28, wherein the p-n junction and the second JFET are in close proximity to each other on a monolithic integrated circuit device.

* * * * *